(12) United States Patent
Shimamura

(10) Patent No.: US 8,093,683 B2
(45) Date of Patent: Jan. 10, 2012

(54) SEMICONDUCTOR DEVICE

(75) Inventor: Tetsuo Shimamura, Gunma (JP)

(73) Assignees: SANYO Semiconductor Co., Ltd., Gunma (JP); Semiconductor Components Industries, LLC, Phoenix, AZ (US)

( * ) Notice: Subject to any disclaimer, the term of this patent is extended or adjusted under 35 U.S.C. 154(b) by 718 days.

(21) Appl. No.: 12/204,565

(22) Filed: Sep. 4, 2008

(65) Prior Publication Data

US 2009/0065899 A1    Mar. 12, 2009

(30) Foreign Application Priority Data

Sep. 6, 2007  (JP) .................................. 2007-231766

(51) Int. Cl.
*H01L 29/735*  (2006.01)
(52) U.S. Cl. .. 257/552; 257/197; 257/355; 257/E29.187
(58) Field of Classification Search .................. 257/197, 257/355, 361, 362, 552, E29.187
See application file for complete search history.

(56) References Cited

U.S. PATENT DOCUMENTS 5,936,284 A * 8/1999 Ravanelli ....................... 257/361
5,976,921 A * 11/1999 Maeda .......................... 438/202

FOREIGN PATENT DOCUMENTS

JP          10-214905          8/1998

OTHER PUBLICATIONS

De Heyn et al, "Design and Analysis of New Protection Structures for Smart Power Technology with Controlled Trigger and Holding Voltage" (2001), IEEE-IRPS ESD/LATCHUP (session 3D-6); 6 pages.

* cited by examiner

*Primary Examiner* — Thinh T Nguyen
(74) *Attorney, Agent, or Firm* — Morrison & Foerster LLP

(57) ABSTRACT

The invention is directed to providing a technique for increasing a hold voltage of an electrostatic breakdown protection device having a bipolar transistor structure more than conventional and reducing the size of the device. A base region (a P impurity layer) is formed on a front surface of an epitaxial layer, an emitter region (an N+ impurity layer) is formed on the front surface of the P impurity layer, and the epitaxial layer and an N+ impurity layer form a collector region. A connected portion of a base electrode and the base region (the P impurity layer) is located between the end of the base region (the P impurity layer) on a collector electrode side and the emitter region (the N+ impurity layer). It means that the electrodes for the collector, the base and the emitter are formed in this order. The base electrode and the emitter electrode are connected through a wiring (not shown). A P+ isolation layer for dividing the epitaxial layer into a plurality of island regions is further formed.

13 Claims, 5 Drawing Sheets

SEMICONDUCTOR DEVICE

CROSS-REFERENCE OF THE INVENTION

This application claims priority from Japanese Patent Application No. 2007-231766, the content of which is incorporated herein by reference in its entirety.

BACKGROUND OF THE INVENTION

1. Field of the Invention

The invention relates to a semiconductor device suitable for use as an electrostatic breakdown protection device.

2. Description of the Related Art

In a semiconductor integrated circuit, in order to prevent a breakdown (an electrostatic breakdown) due to a surge voltage such as static electricity, an overvoltage, electromagnetic noises emitted from peripheral devices or the like, a protection device (hereafter, referred to as an electrostatic breakdown protection device) is provided near input and output terminals.

There is an electrostatic breakdown protection device using a bipolar transistor as well as ones using a diode or a MOS transistor. A device structure of a conventional NPN-type bipolar transistor provided as an electrostatic breakdown protection device will be described referring to FIGS. 5A and 5B. FIG. 5A is a plan view showing the bipolar transistor and FIG. 5B is a cross-sectional view of FIG. 5A along line Y-Y.

An N− type epitaxial layer 101 is formed on a front surface of a P type semiconductor substrate 100, and an N+ type embedded layer 102 is formed on the bottom of the epitaxial layer 101. Furthermore, a P+ isolation layer 103 for dividing the epitaxial layer 101 into a plurality of island regions is formed. The P+ isolation layer 103 has a structure in which an upper isolation layer 103a and a lower isolation layer 103b where P type impurities are added are joined inside the epitaxial layer 101.

A P impurity layer 104 is formed as a base region on the front surface of the epitaxial layer 101, and an N+ impurity layer 105 is formed as an emitter region on the front surface of the P impurity layer 104. Furthermore, an N+ impurity layer 106 is formed on the front surface of the epitaxial layer 101, and the epitaxial layer 101 and the N+ impurity layer 106 form a collector region. Furthermore, an insulation film 107 is formed on the epitaxial layer 101, and a base electrode 108 connected to the P impurity layer 104, an emitter electrode 109 connected to the N+ impurity layer 105, and a collector electrode 110 connected to the N+ impurity layer 106 are formed on this insulation film 107. The base electrode 108 and the emitter electrode 109 are electrically connected through a wiring (not shown). This connection is generally called diode connection.

As described above, the conventional NPN-type bipolar transistor used as an electrostatic breakdown protection device has a structure in which the emitter region (the N+ impurity layer 105) is provided between the N+ impurity layer 106 and the base electrode 108 and the electrodes for the collector, the emitter and the base are provided from the left to the right in this order as shown in FIGS. 5A and 5B.

A relation of a voltage V applied between the collector and the emitter and an emitter current I in this bipolar transistor has characteristics as shown in FIG. 6. Vs is referred to as a snapback voltage and Vh is referred to as a hold voltage.

In order to function as an electrostatic breakdown protection device, the transistor need be designed so that its snapback voltage Vs is lower than a breakdown voltage of a device to be protected. On the other hand, in order to prevent malfunction of the electrostatic breakdown protection device due to latch-up, the transistor need be designed so that its hold voltage Vh is at the operation power supply voltage of the semiconductor integrated circuit or higher. Thus the characteristics of the snapback voltage Vs and the hold voltage Vh are important for designing the electrostatic breakdown protection device.

Supposing the length between the P impurity layer 104 and the N+ impurity layer 106 is t and the length between the end of the P impurity layer 104 on the N+ impurity layer 106 side and the N+ impurity layer 105 is d as shown in FIGS. 5A and 5B, it is known that the device has the following relation (Japanese Patent Application Publication No. hei 10-214905): the hold voltage Vh increases by increasing the value of d and (2) the snapback voltage Vs increases by increasing the value of t.

Therefore, the snapback voltage Vs and the hold voltage Vh are adjusted by adjusting the values of t and d so as to provide desired operation characteristics to the bipolar transistor as the electrostatic breakdown protection device.

The above described technique and the relevant technique to this are described in Japanese Patent Application Publication No. hei 10-214905 and "Design And Analysis of New Protection Structures for Smart Power Technology with Controlled Trigger and Holding Voltage" (2001), IEEE-IRPS ESD/LATCHUP (session 3D-6), P253.

As described above, a hold voltage Vh need be set at an operation power supply voltage of a semiconductor integrated circuit or more. Therefore, it has been conceived that a high hold voltage Vh is obtained by increasing the value of d when a bipolar transistor having the described structure is used as an electrostatic breakdown protection device.

However, it is found from a result of an experiment conducted by the inventor that even if the value of d is increased in the conventional structure, the increase of the hold voltage Vh relative to the increase of d tends to gradually saturate as shown by VH1 in FIG. 2. Therefore, in the conventional structure, the countermeasure of increasing the value of d sometimes has a difficulty in increasing a hold voltage Vh enough. Furthermore, there is a problem that the increase of the value of d leads to the increase of the size of the electrostatic breakdown protection device.

Accordingly, the invention is directed to providing a technique of increasing a hold voltage more than conventional when a bipolar transistor is used as an electrostatic breakdown protection device and preventing the size of the protection device from increasing.

SUMMARY OF THE INVENTION

The invention provides a protection device for a semiconductor circuit. The device includes a semiconductor layer of a first general conductive type, a collector region including a portion of the semiconductor layer and an impurity region of the first general conductive type formed in the semiconductor layer and having an impurity concentration higher than the impurity concentration of the semiconductor layer, a base region of a second general conductive type formed in the semiconductor layer, an emitter region of the first general conductive type formed in the base region, a collector electrode in contact with the collector region, a base electrode in contact with the base region, and an emitter electrode in contact with the emitter region. The base electrode is connected to the emitter electrode and the portion of the base region that is in contact with the base electrode is placed between the impurity region and the emitter region.

DETAILED DESCRIPTION OF THE INVENTION

Figure 1A:
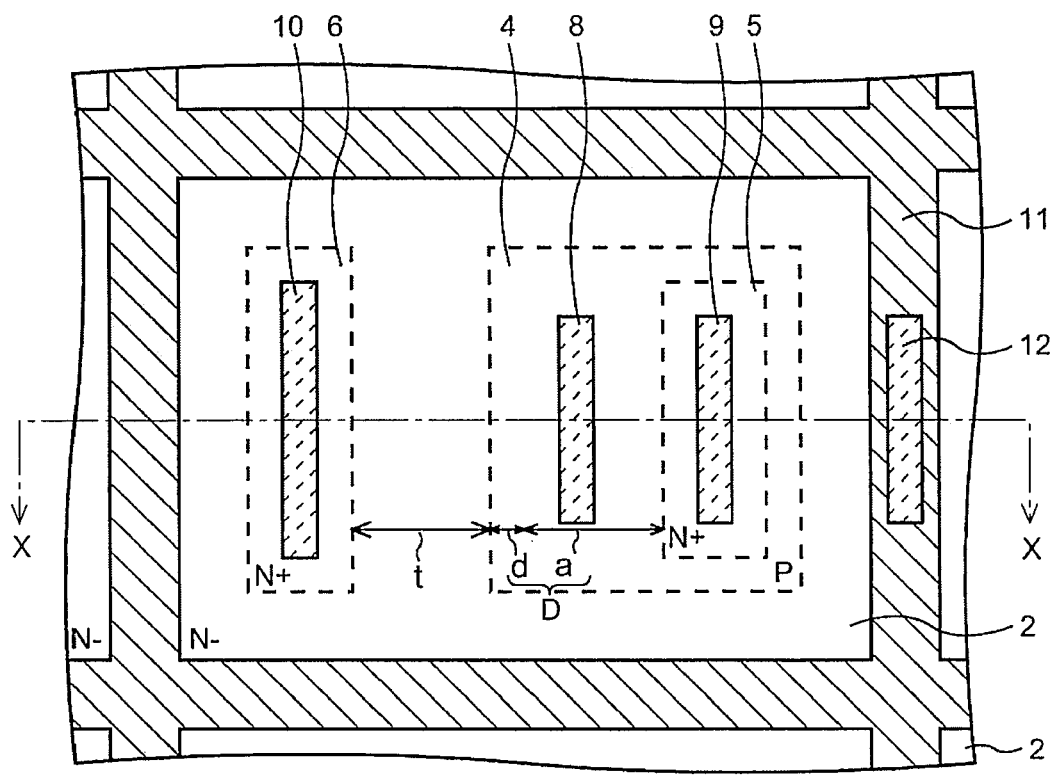
FIGS. 1A and 1B are a plan view and a cross-sectional view showing a semiconductor device of an embodiment of the invention.
Figure 1B:
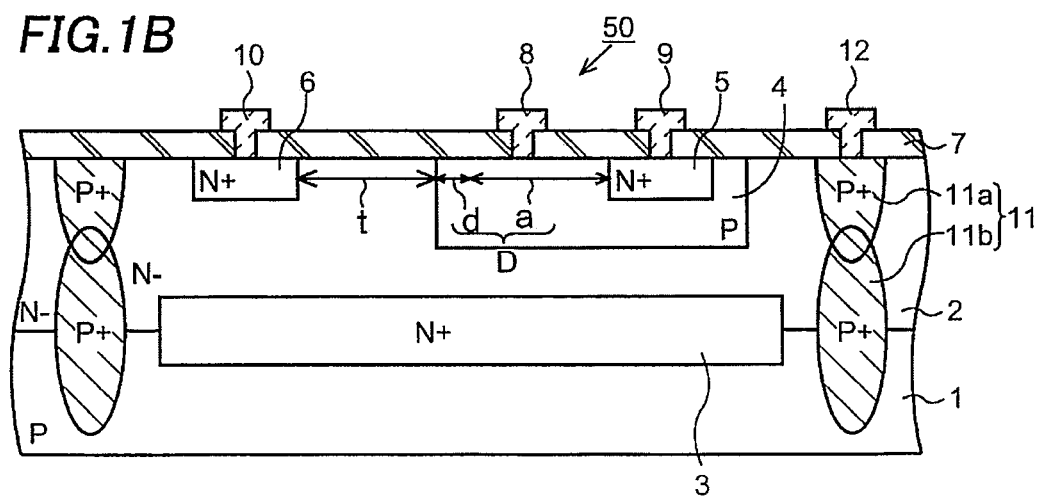

A semiconductor device of an embodiment of the invention will be described referring to figures. FIG. 1A is a schematic plan view showing a semiconductor device of the embodiment, and FIG. 1B is a cross-sectional view of FIG. 1A along line X-X.

An N− type epitaxial layer 2 is formed on a front surface of a P type semiconductor substrate 1 made of silicon or the like, and an N+ type embedded layer 3 having higher concentration than the epitaxial layer 2 is formed on the bottom of the epitaxial layer 2. The epitaxial layer 2 and the embedded layer 3 are formed by implanting a high concentration of N type impurity (e.g. phosphorus) in the semiconductor substrate 1 and then performing epitaxial growth by a given method.

It is noted that conductivity types such as N+, N and N− belong in one general conductivity type and conductivity types such as P+, P and P− belong in another general conductivity type.

A semiconductor device of a bipolar transistor structure (an NPN type bipolar transistor 50 in the embodiment) is formed on the front surface of the epitaxial layer 2. In detail, a P impurity layer 4 is formed as a base region in a given region of the epitaxial layer 2, and an N+ impurity layer 5 is formed as an emitter region on the front surface of the P impurity layer 4. An N+ impurity layer 6 having higher concentration than the epitaxial layer 2 is further formed on the front surface of the epitaxial layer 2, and the epitaxial layer 2 and the N+ impurity layer 6 form a collector region. An insulation film 7 (e.g. a silicon oxide film by a thermal oxidation method or a CVD method) is formed covering the epitaxial layer 2. Contact holes are formed in given regions of the insulation film 7, and a base electrode 8 connected to the P impurity layer 4, an emitter electrode 9 connected to the N+ impurity layer 5 and a collector electrode 10 connected to the N+ impurity layer 6 are formed in the contact holes, respectively. The base electrode 8 and the emitter electrode 9 are connected through a wiring (not shown).

Figure 5A:
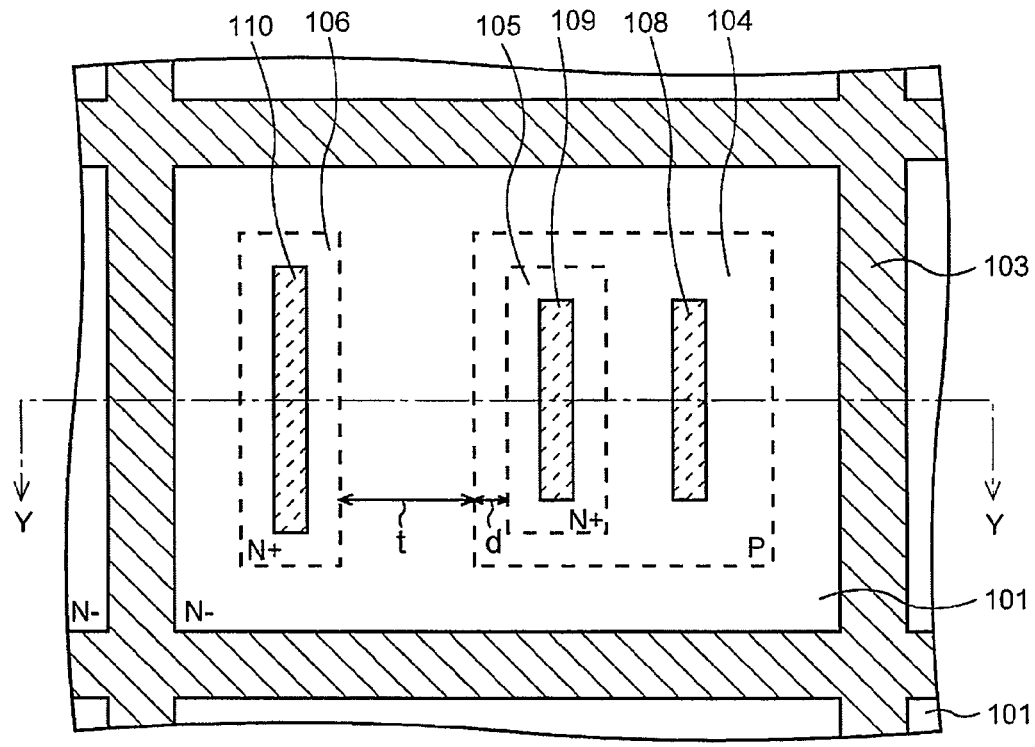
FIGS. 5A and 5B are a plan view and a cross-sectional view for explaining a conventional semiconductor device.
Figure 5B:
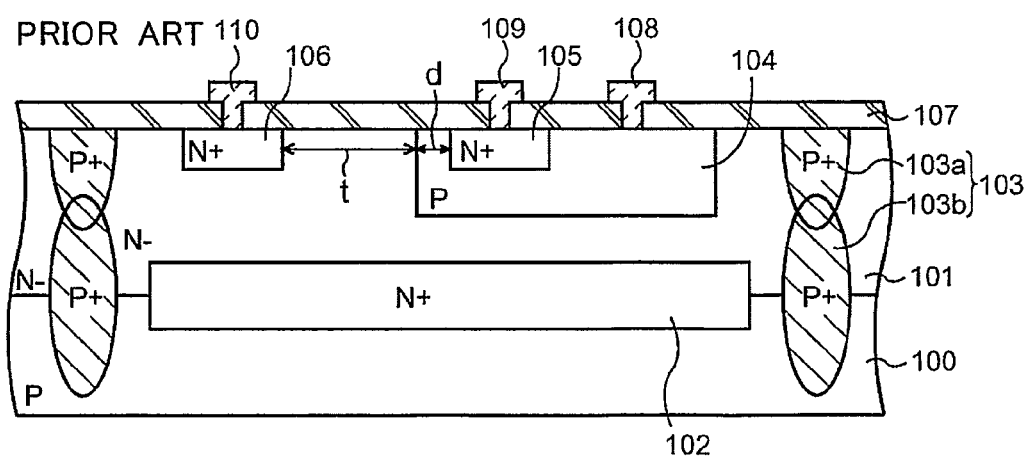
Figure 6:
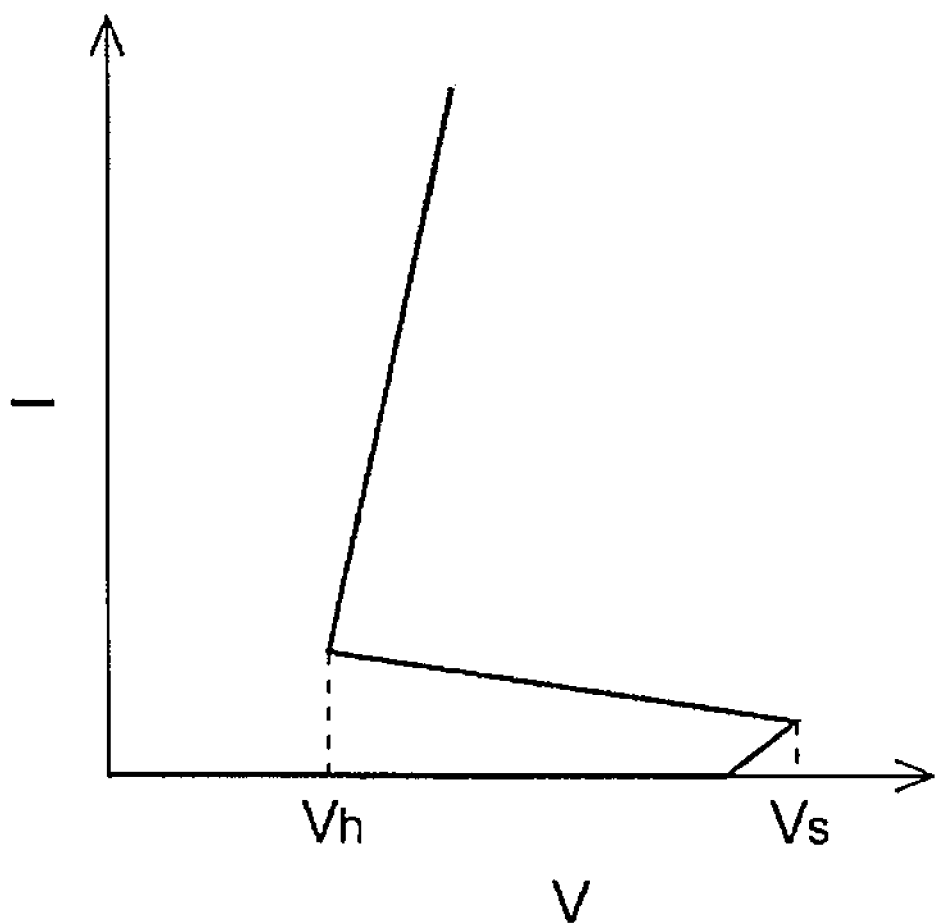
FIG. 6 is a graph showing snapback characteristics of a bipolar transistor used as an electrostatic breakdown protection device.

In this embodiment, the connected portion of the base electrode 8 and the base region (the P impurity layer 4) is located between the end of the base region (the P impurity layer 4) on the collector electrode 10 side and the emitter region (the N+ impurity layer 5) as shown in FIGS. 1A and 1B. In detail, as shown in FIGS. 1A and 1B, the electrodes for the collector, the base and the emitter are formed from the left to the right in this order, and this is largely different from the conventional structure (FIG. 5) in which electrodes for a collector, an emitter and a base are formed in this order.

A P+ isolation layer 11 for dividing the epitaxial layer 2 into a plurality of island regions is further formed. The P+ isolation layer 11 has a structure in which an upper isolation layer 11a and a lower isolation layer 11b where P-type impurities are added are partially overlapped and joined inside the epitaxial layer 2, and is annularly formed surrounding the region where the bipolar transistor 50 is formed in the embodiment. The upper isolation layer 11a is formed by diffusing a P-type impurity such as boron (B) from the upper surface of the epitaxial layer 2. On the other hand, the lower isolation layer 11b is formed by diffusing a P-type impurity such as boron (B) from the bottom side of the epitaxial layer 2. Since adjacent devices divided by the P+ isolation layer 11 are electrically isolated, various devices (a MOS transistor, a capacitor, other bipolar transistor or the like) may be formed on the epitaxial layer 2 adjacent to the bipolar transistor 50.

Furthermore, a contact hole is formed in the insulation film 7 in a position corresponding to the P+ isolation layer 11, and a substrate potential fixing electrode 12 is formed in this contact hole. The substrate potential fixing electrode 12 fixes the potential of the semiconductor substrate 1. Although the position for providing the substrate potential fixing electrode 12 is not limitative, it is preferable to locate the connected portion of the substrate potential fixing electrode 12 and the P+ isolation layer 11 adjacent to the bipolar transistor 50, for enhancing electrostatic breakdown protection characteristics of the bipolar transistor 50. This is because that forward characteristics of a parasitic diode is enhanced. This will be described below.

As shown in FIGS. 1A and 1B, the length between the P impurity layer 4 and the N+ impurity layer 6 is referred to as t, and the length between the end of the P impurity layer 4 on the N+ impurity layer 6 side and the N+ impurity layer 5 is referred to as D. When the structure except the emitter region (the N+ impurity layer 5), the emitter electrode 9 and the base electrode 8 is the same as the conventional structure (FIG. 5), D is longer than d in the structure (bipolar transistor 50) of the embodiment since the electrodes for the collector, the base and the emitter are formed in this order. Therefore, D is expressed by an equation of D=d+a ("d" is the distance shown in FIGS. 5A and 5B, and "a" is a constant that accounts for the placement of the emitter). Furthermore, it is preferable that D is longer than t. D need have a length equal to the width of the connected portion of the base electrode 8 and the P impurity layer 4 or more.

When an electrostatic breakdown test is performed under the same condition for the structure of the embodiment (the bipolar transistor 50) and the conventional structure (FIG. 5) except the structure of the emitter region, the emitter electrode and the base electrode, it is found that the hold voltage Vh is higher than that of the conventional structure while the value of the snapback voltage Vs of the bipolar transistor 50 is hardly different from the conventional structure (FIG. 5).

Figure 2:
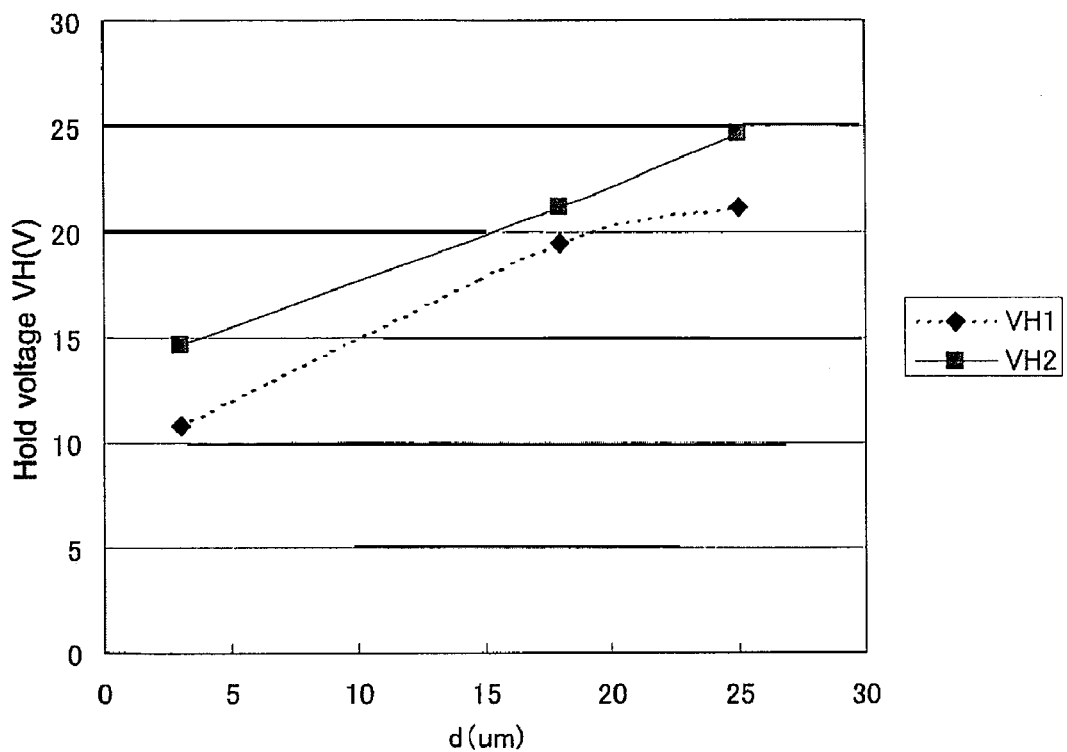
FIG. 2 is a graph showing a hold voltage of the embodiment of the invention and a hold voltage of a conventional structure.

"The relation of d and the hold voltage Vh" of the bipolar transistor 50 is now compared with that of the conventional structure. The graph shown in FIG. 2 shows "the relation of d and the hold voltage Vh (VH1)" of the conventional structure and "the relation of d and the hold voltage Vh (VH2)" of the bipolar transistor 50. In the graph, the axis of abscissas d indicates the values of d in the conventional structure. From the result of this test, it is found the hold voltage Vh of the bipolar transistor 50 is higher than the hold voltage Vh of the conventional structure in the whole range of measured d. Furthermore, while the hold voltage Vh of the conventional structure gradually saturates when it exceeds about 20V, the hold voltage Vh of the bipolar transistor 50 increases even after it exceeds about 20V without saturating. That is, it is found that the hold voltage of the bipolar transistor 50 is higher than the hold voltage of the conventional structure.

It is noted that in the structure shown in FIGS. 1A and 1B an increase in the value "d" means that the emitter region 5 moves to the right by the increased amount of "d" because "a" is a constant value, as explained above.

Therefore, when the NPN-type bipolar transistor of the embodiment is used as an electrostatic breakdown protection device, the hold voltage Vh becomes higher than the conventional one without changing the size of the transistor from the conventional one, and the transistor is applicable to a semiconductor integrated circuit requiring a high operation power supply voltage. In other words, the hold voltage Vh equivalent to that of the conventional transistor is realized by the bipolar transistor with a smaller area than conventional. Accordingly, the area necessary for the electrostatic breakdown protection device is reduced compared with the conventional one.

Figure 3:
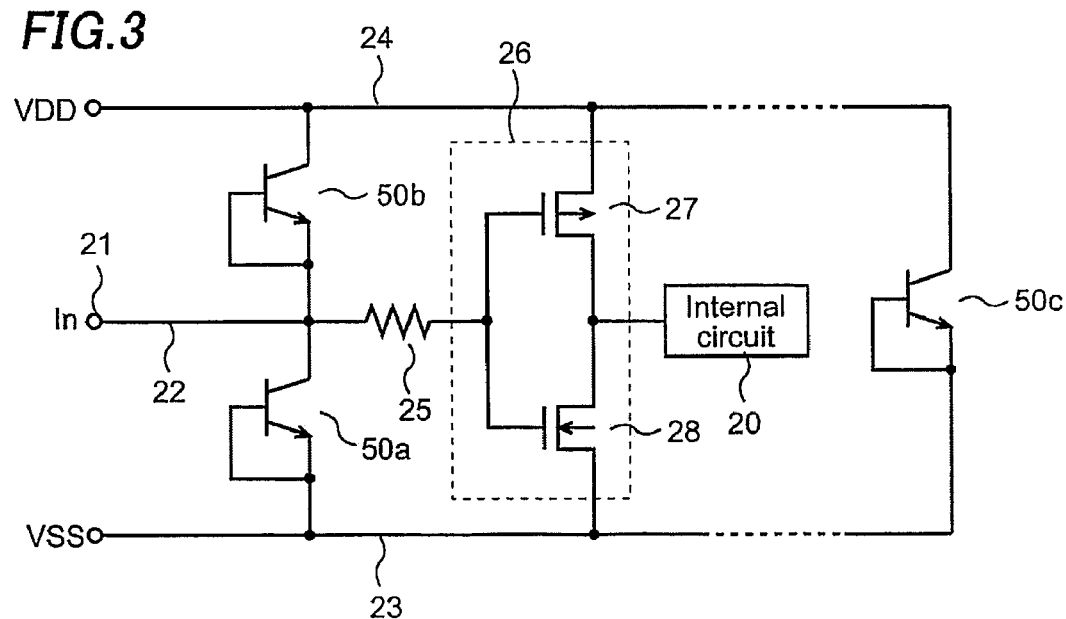
FIG. 3 is a circuit diagram showing the semiconductor device of the embodiment of the invention.

Next, a detailed embodiment in a case of using the above-described bipolar transistor 50 as an electrostatic breakdown protection device will be described referring to a circuit diagram in FIG. 3. An internal circuit 20 is provided on a semiconductor substrate made of silicon or the like. The internal circuit 20 is an analog circuit or a digital circuit, including an input circuit, an output circuit, an input/output circuit or the like.

A bipolar transistor (referred to as a bipolar transistor 50a) having the above-described structure of which the collector electrode 10 is connected to a wiring 22 connecting the internal circuit 20 and an input terminal 21 and the emitter electrode 9 and the base electrode 8 are connected to a VSS wiring 23 and a bipolar transistor (referred to as a bipolar transistor 50b) having the above-described structure of which the collector electrode 10 is connected to a VDD wiring 24 and the emitter electrode 9 and the base electrode 8 are connected to the wiring 22 are connected to the wiring 22 as electrostatic breakdown protection devices.

A ground voltage GND is supplied to the VSS wiring 23, and a power supply voltage VDD is supplied to the VDD wiring 24. The P+ isolation layer 11 is connected to the VSS wiring 23 through the substrate potential fixing electrode 12, and the semiconductor substrate 1 is fixed to the ground potential.

A protective resistance 25 and a CMOS circuit 26 forming an input buffer of the internal circuit 20 are connected between the input terminal 21 and the internal circuit 20. The CMOS circuit 26 is formed by serially connecting a P-channel type MOS transistor 27 of which the source is connected to the VDD wiring 24 and an N-channel type MOS transistor 28 of which the source is connected to the VSS wiring 23.

Furthermore, a bipolar transistor (referred to as a bipolar transistor 50c) having the above-described structure in which the collector electrode 10 is connected to the VDD wiring 24 and the emitter electrode 9 and the base electrode 8 are connected to the VSS wiring 23 is connected between the VSS wiring 23 and the VDD wiring 24 as an electrostatic breakdown protection device. In this manner, the bipolar transistor 50 of the embodiment shown in FIG. 1 is disposed as the bipolar transistors 50a, 50b and 50c as shown in FIG. 3.

The electrostatic breakdown protection operations of the bipolar transistors 50a, 50b and 50c will be briefly described. In this circuit, when a positive overvoltage is applied to the input terminal 21 and this overvoltage exceeds the snapback voltage of the bipolar transistor 50a, a current flows through the bipolar transistor 50a and this current escapes outside through the VSS wiring 23. Furthermore, when a negative overvoltage is applied to the input terminal 21, i.e., an overvoltage by which the VDD wiring 24 side turns to the positive polarity is applied to the input terminal 21 and this overvoltage exceeds the snapback voltage of the bipolar transistor 50b, a current flows through the bipolar transistor 50b and this current escapes outside through the VDD wiring 24. In this case, as a forward bias voltage is applied to the base-collector junction of the bipolar transistor 50a, a current naturally flows through the bipolar transistor 50a. And this current escapes outside through the VSS wiring 23. Furthermore, when the VDD wiring 24 has a positive overvoltage relative to the VSS wiring 23 and this overvoltage exceeds the snapback voltage of the bipolar transistor 50c, a current flows through the bipolar transistor 50c and this current escapes outside through the VSS wiring 23. In these manners, the CMOS circuit 26 or the internal circuit 20 is protected from an electrostatic breakdown.

Figure 4:
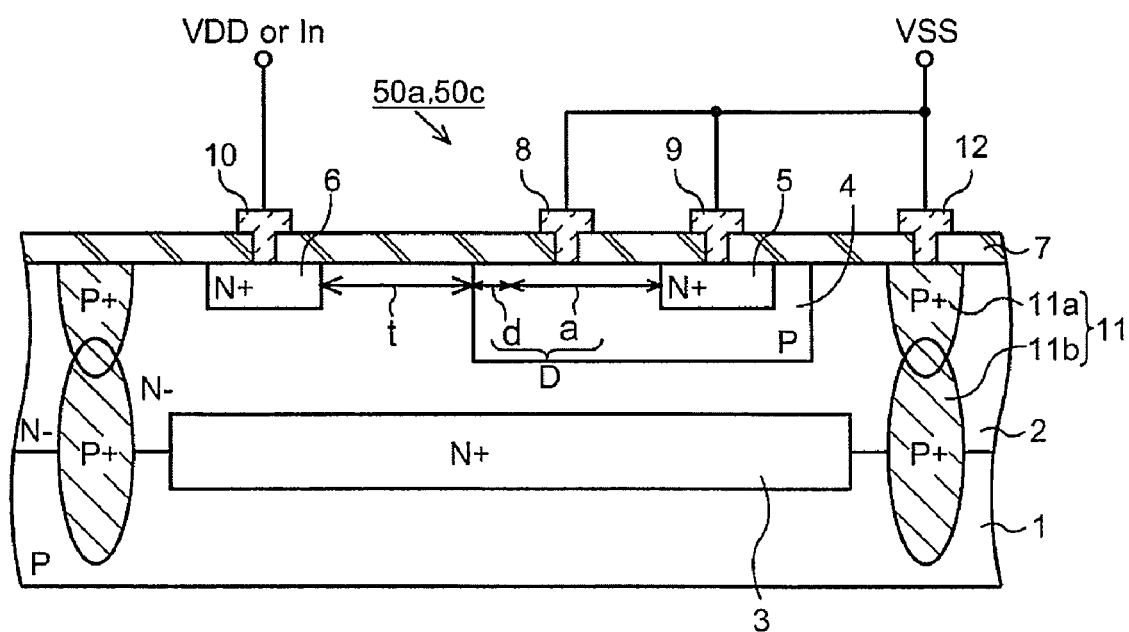
FIG. 4 is a cross-sectional view showing the semiconductor device of the embodiment of the invention.

It is preferable that the electrode supplying the ground potential to the semiconductor substrate 1 is disposed adjacent to the bipolar transistors 50a, 50b and 50c. In other words, it is preferable that the substrate potential fixing electrode 12 connected to the VSS wiring 23 is disposed adjacent to at least one of the bipolar transistors 50a, 50b and 50c in the same manner as shown in FIGS. 1A and 1B. With this state, it is preferable that the base electrode 8 and the emitter electrode 9 in each of the bipolar transistors 50a and 50c are connected to the substrate potential fixing electrode 12 as shown in FIG. 4. This is because that when a negative overvoltage relative to the VSS wiring 23 is applied to the input terminal 21, this structure enhances forward characteristics of a parasitic diode (a parasitic diode using the semiconductor substrate 1 and the P+ isolation layer 11 as an anode and the collector region (the epitaxial layer 2 and the N+ impurity layer 6) and the embedded layer 3 as a cathode) formed in each of the bipolar transistors 50a and 50c, and a rapid escape of a current enhances electrostatic breakdown resistance.

In this manner, disposing the connected portion of the substrate potential fixing electrode 12 and the P+ isolation layer 11 adjacent to a bipolar transistor functioning as an electrostatic breakdown protection device realizes formation of a device having enhanced electrostatic breakdown resistance.

As described above, by using the NPN-type bipolar transistor of the embodiment as an electrostatic breakdown protection device, the hold voltage Vh becomes higher than conventional and the area necessary for the electrostatic breakdown protection device becomes smaller than conventional. Furthermore, as shown in the embodiment, providing a substrate potential fixing electrode enhances the electrostatic breakdown resistance more than conventional.

The invention is not limited to the above-described embodiment, and modification is possible within the scope of the invention. For example, although the NPN-type bipolar transistor is described in the above-described embodiment, a formation of a PNP-type bipolar transistor is possible by forming a structure of a reverse conductive type to that shown in the above-described embodiment. Furthermore, although the bipolar transistors 50a and 50b are connected to the wiring 22 connected to the input terminal 21 in the above-described embodiment, these may be connected to a wiring connecting an output terminal (not shown) and the internal circuit or may be directly connected to the input terminal 21 or an output terminal. The invention is widely applicable as a technique for increasing a hold voltage of a bipolar transistor used as an electrostatic breakdown protection device.

What is claimed is:

1. A protection device for a semiconductor circuit, comprising:
a semiconductor layer of a first general conductive type;
a collector region comprising a portion of the semiconductor layer and an impurity region of the first general conductive type formed in the semiconductor layer and having an impurity concentration higher than an impurity concentration of the semiconductor layer;

a base region of a second general conductive type formed in the semiconductor layer;

an emitter region of the first general conductive type formed in the base region;

a collector electrode in contact with the collector region;

a base electrode in contact with the base region; and an emitter electrode in contact with the emitter region, wherein the base electrode is connected to the emitter electrode, and a portion of the base region that is in contact with the base electrode is disposed between the impurity region and the emitter region so that the base electrode is between the emitter electrode and the collector electrode.

2. A protection device for a semiconductor circuit, comprising:

a semiconductor layer of a first general conductive type;

a collector region comprising a portion of the semiconductor layer and an impurity region of the first general conductive type formed in the semiconductor layer and having an impurity concentration higher than an impurity concentration of the semiconductor layer;

a base region of a second general conductive type formed in the semiconductor layer;

an emitter region of the first general conductive type formed in the base region;

a collector electrode in contact with the collector region;

a base electrode in contact with the base region;

an emitter electrode in contact with the emitter region;

an isolation layer of the second general conductive type formed in the semiconductor layer so as to isolate the collector region, the base region and the emitter region as a bipolar transistor; and a substrate potential fixing electrode connected to the isolation layer, wherein the base electrode is connected to the emitter electrode, a portion of the base region that is in contact with the base electrode is disposed between the impurity region and the emitter region, and the substrate potential fixing electrode is in contact with the isolation layer surrounding the bipolar transistor.

3. The protection device of claim 2, wherein the substrate potential fixing electrode is connected to the base electrode and the emitter electrode.

4. The protection device of claim 1, further comprising a first wiring connecting an input terminal and a circuit formed on the semiconductor layer and a second wiring supplying a power supply voltage or a ground voltage, wherein the collector electrode is connected to the input terminal or the first wiring, and the base electrode and the emitter electrode are connected to the second wiring.

5. The protection device of claim 2, further comprising a first wiring connecting an input terminal and a circuit formed on the semiconductor layer and a second wiring supplying a power supply voltage or a ground voltage, wherein the collector electrode is connected to the input terminal or the first wiring, and the base electrode and the emitter electrode are connected to the second wiring.

6. The protection device of claim 3, further comprising a first wiring connecting an input terminal and a circuit formed on the semiconductor layer and a second wiring supplying a power supply voltage or a ground voltage, wherein the collector electrode is connected to the input terminal or the first wiring, and the base electrode and the emitter electrode are connected to the second wiring.

7. The semiconductor device of claim 1, further comprising a first wiring connecting an input terminal and a circuit formed on the semiconductor layer, a second wiring supplying a power supply voltage and a third wiring supplying a ground voltage, wherein the collector electrode is connected to the first wiring and the base electrode and the emitter electrode are connected to the third wiring, alternatively the collector electrode is connected to the second wiring and the base electrode and the emitter electrode are connected to the first wiring.

8. The semiconductor device of claim 2, further comprising a first wiring connecting an input terminal and a circuit formed on the semiconductor layer, a second wiring supplying a power supply voltage and a third wiring supplying a ground voltage, wherein the collector electrode is connected to the first wiring and the base electrode and the emitter electrode are connected to the third wiring, alternatively the collector electrode is connected to the second wiring and the base electrode and the emitter electrode are connected to the first wiring.

9. The semiconductor device of claim 3, further comprising a first wiring connecting an input terminal and a circuit formed on the semiconductor layer, a second wiring supplying a power supply voltage and a third wiring supplying a ground voltage, wherein the collector electrode is connected to the first wiring and the base electrode and the emitter electrode are connected to the third wiring, alternatively the collector electrode is connected to the second wiring and the base electrode and the emitter electrode are connected to the first wiring.

10. The semiconductor device of claim 1, further comprising a power supply wiring supplying a power supply voltage and a ground wiring supplying a ground voltage, wherein the collector electrode is connected to the power supply wiring and the base electrode and the emitter electrode are connected to the ground wiring.

11. The semiconductor device of claim 2, further comprising a power supply wiring supplying a power supply voltage and a ground wiring supplying a ground voltage, wherein the collector electrode is connected to the power supply wiring and the base electrode and the emitter electrode are connected to the ground wiring.

12. The semiconductor device of claim 3, further comprising a power supply wiring supplying a power supply voltage and a ground wiring supplying a ground voltage, wherein the collector electrode is connected to the power supply wiring and the base electrode and the emitter electrode are connected to the ground wiring.

13. The semiconductor device of claim 1, wherein a distance between the emitter region and a lateral edge of the base region closest to the impurity region is larger than a distance between the impurity region and the lateral edge of the base region.

* * * * *